United States Patent
Noh et al.

(10) Patent No.: US 11,206,042 B2
(45) Date of Patent: Dec. 21, 2021

(54) LAYERED DECODING METHOD FOR LDPC CODE AND DEVICE THEREFOR

(71) Applicant: LG Electronics Inc., Seoul (KR)

(72) Inventors: Kwangseok Noh, Seoul (KR); Dongkyu Kim, Seoul (KR); Myeongjin Kim, Seoul (KR); Sangrim Lee, Seoul (KR); Hojae Lee, Seoul (KR)

(73) Assignee: LG Electronics Inc., Seoul (KR)

( * ) Notice: Subject to any disclaimer, the term of this patent is extended or adjusted under 35 U.S.C. 154(b) by 158 days.

(21) Appl. No.: 16/492,458

(22) PCT Filed: Mar. 9, 2017

(86) PCT No.: PCT/KR2017/002546
§ 371 (c)(1),
(2) Date: Sep. 9, 2019

(87) PCT Pub. No.: WO2018/164297
PCT Pub. Date: Sep. 13, 2018

(65) Prior Publication Data
US 2021/0218418 A1   Jul. 15, 2021

(51) Int. Cl.
*H03M 13/11*   (2006.01)
*H03M 13/09*   (2006.01)
(Continued)

(52) U.S. Cl.
CPC ....... *H03M 13/1105* (2013.01); *H03M 13/09* (2013.01); *H03M 13/1148* (2013.01);
(Continued)

(58) Field of Classification Search
CPC ......... H03M 13/1105; H03M 13/1148; H03M 13/6575; H03M 13/09; H04L 1/0041; H04L 1/0061; H04L 1/0045
See application file for complete search history.

(56) References Cited

U.S. PATENT DOCUMENTS 8,984,376 B1   3/2015   Norrie
9,136,877 B1 * 9/2015   Chen ................. H03M 13/1117
(Continued)

FOREIGN PATENT DOCUMENTS

CN   101595644   12/2009
CN   104769556   7/2015
(Continued)

OTHER PUBLICATIONS

Extended European Search Report in European Application No. 17899375.4, dated Nov. 3, 2020, 9 pages.
(Continued)

*Primary Examiner* — Thien Nguyen
(74) *Attorney, Agent, or Firm* — Fish & Richardson P.C.

(57) ABSTRACT

An improved layered decoding method for a low density parity check (LDPC) code and a device therefor are disclosed. Disclosed is the layered decoding method for an LDPC code, capable of determining whether decoding is successful by performing a syndrome check on each check node at every variable node update. In addition, the syndrome check can be performed by using reduced variable nodes, thereby reducing decoding power consumption and decoding time consumption.

4 Claims, 16 Drawing Sheets

(51) Int. Cl.
*H03M 13/00* (2006.01)
*H04L 1/00* (2006.01)

(52) U.S. Cl.
CPC ...... *H03M 13/6575* (2013.01); *H04L 1/0041* (2013.01); *H04L 1/0045* (2013.01); *H04L 1/0061* (2013.01)

(56) References Cited

U.S. PATENT DOCUMENTS

| | | | |
|---|---|---|---|
| 2013/0173982 | A1 | 7/2013 | Moon et al. |
| 2013/0254628 | A1* | 9/2013 | Kim ............... H03M 13/1174 714/773 |
| 2014/0059401 | A1 | 2/2014 | Chung et al. |
| 2016/0043745 | A1 | 2/2016 | Vojcic et al. |
| 2016/0055057 | A1 | 2/2016 | Shin et al. |
| 2016/0274971 | A1 | 9/2016 | Kang et al. |
| 2017/0134048 | A1* | 5/2017 | Bar ............... H03M 13/1111 |
| 2020/0014408 | A1* | 1/2020 | Kim ............... H03M 13/6325 |
| 2021/0075442 | A1* | 3/2021 | Myung ........... H03M 13/1102 |

FOREIGN PATENT DOCUMENTS

| | | |
|---|---|---|
| CN | 105390162 | 3/2016 |
| JP | 2005045735 | 2/2005 |
| JP | 2009100222 | 5/2009 |
| JP | 2011055168 | 3/2011 |
| JP | 2012182623 | 9/2012 |
| JP | 2013141219 | 7/2013 |
| JP | 2015536595 | 12/2015 |
| KR | 20140032524 | 3/2014 |
| KR | 20150067338 | 6/2015 |
| KR | 20160024247 | 3/2016 |
| KR | 20160113001 | 9/2016 |

OTHER PUBLICATIONS

Phakphisut et al., "Serial Belief Propagation for The High-Rate LDPC Decoders and Performances in The Bit Patterned Media Systems With Media Noise," IEEE Transactions On Magnetics, vol. 47, No. 10, dated Oct. 2011, 49 pages.

Xia et al., "A Novel Fast LDPC Decoder Using APP-based Dynamic Scheduling Scheme," IEEE Global Communications Conference (GLOBECOM), dated Dec. 6-10, 2015, 8 pages.

PCT International Search Report and Written Opinion in International Application No. PCT/KR2017/002546, dated Dec. 5, 2017, 23 pages (with English translation).

Office Action in Chinese Appln. No. 201780088167.X, dated Jul. 1, 2021, 15 pages (with English translation).

\* cited by examiner

FIG. 7

$$H = \begin{bmatrix} P^{h^b_{00}} & P^{h^b_{01}} & P^{h^b_{02}} & \cdots & P^{h^b_{0\,nb}} \\ P^{h^b_{10}} & P^{h^b_{11}} & P^{h^b_{12}} & \cdots & P^{h^b_{1\,nb}} \\ \cdots & \cdots & \cdots & \cdots & \cdots \\ P^{h^b_{mb\,0}} & P^{h^b_{mb\,1}} & P^{h^b_{mb\,2}} & \cdots & P^{h^b_{mb\,nb}} \end{bmatrix} = P^{H_b}$$

$$\begin{bmatrix} 1 & 0 & 0 & 0 \\ 0 & 1 & 0 & 0 \\ 0 & 0 & 1 & 0 \\ 0 & 0 & 0 & 1 \end{bmatrix} \xrightarrow{\text{3 right shift}} \begin{bmatrix} 0 & 0 & 0 & 1 \\ 1 & 0 & 0 & 0 \\ 0 & 1 & 0 & 0 \\ 0 & 0 & 1 & 0 \end{bmatrix}$$

LAYERED DECODING METHOD FOR LDPC CODE AND DEVICE THEREFOR

CROSS-REFERENCE TO RELATED APPLICATIONS

This application is a National Stage application under 35 U.S.C. § 371 of International Application No. PCT/KR2017/002546, filed on Mar. 9, 2017, the disclosure of which is incorporated by reference in its entirety.

TECHNICAL FIELD

The present disclosure relates to a method of decoding a channel code in a wireless communication system, and more particularly, to a method and apparatus for layered decoding of a low-density parity-check (LDPC) code.

BACKGROUND ART

Wireless communication systems A wireless access system has been widely deployed to provide a diverse range of communication services such as a voice communication service and a data communication service. Generally, the wireless access system is a multiple access system capable of supporting communication with multiple users by sharing available system resources (e.g., bandwidth, transmit power, etc.). For example, the multiple access system may include one of a code division multiple access (CDMA) system, a frequency division multiple access (FDMA) system, a time division multiple access (TDMA) system, an orthogonal frequency division multiple access (OFDMA) system, a single carrier frequency division multiple access (SC-FDMA) system, a multi-carrier frequency division multiple access (MC-FDMA) system, and the like.

In a broadcast system as well as in the above-described communication system, a channel code is necessarily used. As an example of a general configuration method of the channel code, a transmitter may encode an input symbol using an encoder and transmit the encoded symbol. A receiver, for example, may receive the encoded symbol and decode the received symbol, thereby recovering the input symbol. In this case, the size of the input symbol and the size of the encoded symbol may be differently defined according to a communication system. For example, in a turbo code for data information used in a 3rd generation partnership project (3GPP) long term evolution (LTE) communication system, the size of the input symbol is a maximum of 6144 bits and the size of the encoded symbol is 18432 (6144*3) bits. For turbo coding of the LTE communication system, reference is made to 3GPP technical specification 36.212.

However, even when a signal-to-noise ratio (SNR) increases, the LTE turbo code is characterized in that performance improvement is not remarkable out of a predetermined region due to the structure of the code. Regarding this problem, although use of a code having a low error rate may be considered, complexity increases.

In a communication system, a high error rate may require unnecessary retransmission of data and cause failure in channel reception. In addition, a code having excessively high complexity may increase overhead of a base station (BS) and a user equipment (UE) and cause transmission and reception latency. Especially, in a future-generation communication system requiring faster data transmission and reception, the above-described problems need to be solved. Therefore, a coding method having low complexity while lowering an error rate is demanded.

Particularly, a current LTE turbo code generates error floor as the size of information increases. Therefore, a channel coding method satisfying ultra-reliable radio (URR) and low latency radio (LLR) is needed.

DISCLOSURE

Technical Problem

An aspect of the present disclosure devised to solve the conventional problem is to provide a method of decoding a low-density parity-check (LDPC) code, with reduced power consumption and latency.

Another aspect of the present disclosure is to provide an apparatus supporting the above method.

It will be appreciated by persons skilled in the art that the objects that could be achieved with the present disclosure are not limited to what has been particularly described hereinabove and the above and other objects that the present disclosure could achieve will be more clearly understood from the following detailed description.

Technical Solution

In an aspect of the present disclosure, a method for layered decoding of a low-density parity-check (LDPC) code at a user equipment (UE) includes calculating a log likelihood value from an input signal, initializing a plurality of variable nodes based on the likelihood ratio value, and iterating update of a plurality of check nodes based on a parity check matrix and values of the plurality of variable nodes and update of the plurality of variable nodes based on the parity check matrix and values of the plurality of check nodes, until it is determined whether decoding of the input signal is successful or failed based on syndrome check for the plurality of check nodes. The iteration comprises sequentially updating the plurality of variable nodes, and each time one variable node is updated, performing syndrome check for the plurality of check nodes, linkage between the plurality of check nodes and the plurality of variable nodes is determined based on the parity check matrix, and if syndrome check values of all of the plurality of check nodes are 0, it is determined that the decoding is successful.

If the iteration is repeated a predetermined number of or more times, it may be determined that the decoding is failed.

The performing of syndrome check may include performing the syndrome check by using syndrome check values of check nodes connected to one variable node updated at a current iteration and syndrome check values of remaining check nodes calculated at a previous iteration.

A 1-bit flag indicating a syndrome check value may be set for each of the plurality of check nodes.

The performing of syndrome check may include performing the syndrome check by exclusive OR (XOR)-operating values of variable nodes connected to each of the plurality of check nodes.

The plurality of check nodes may include a first check node and a second check node following the first check node, and syndrome check may be performed for the second check node by XOR-operating values of remaining variable nodes obtained by excluding variable nodes connected to the first check node from variable nodes connected to the second check node.

In another aspect of the present disclosure, a UE includes a transceiver configured to transmit and receive a signal, a memory, and a processor configured to control the transceiver and the memory. The processor is further configured to calculate a log likelihood value from an input signal, initialize a plurality of variable nodes based on the likelihood ratio value, and iterate update of a plurality of check nodes based on a parity check matrix and values of the plurality of variable nodes and update of the plurality of variable nodes based on the parity check matrix and values of the plurality of check nodes, until it is determined whether decoding of the input signal is successful or failed based on syndrome check for the plurality of check nodes. The plurality of variable nodes are sequentially updated, syndrome check is performed for the plurality of check nodes each time one variable node is updated, linkage between the plurality of check nodes and the plurality of variable nodes is determined based on the parity check matrix, and if syndrome check values of all of the plurality of check nodes are 0, it is determined that the decoding is successful.

The above-described aspects of the present disclosure are only a part of the preferred embodiments of the present disclosure, and various embodiments reflecting the technical features of the present disclosure can be derived and understood by those skilled in the art based on the detailed description of the present disclosure.

Advantageous Effects

The embodiments of the present disclosure have the following effects.

The method of decoding an LDPC code according to the present disclosure has a smaller number of memory reads than a legacy method of decoding an LDPC code.

Further, the method of decoding an LDPC code according to the present disclosure has low power consumption and latency.

It will be appreciated by persons skilled in the art that the effects that can be achieved with the present disclosure are not limited to what has been particularly described hereinabove and other advantages of the present disclosure will be more clearly understood from the following detailed description taken in conjunction with the accompanying drawings.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings:

FIG. 7 is a diagram illustrating an exemplary structured parity check matrix.

FIG. 8 is a diagram illustrating an exemplary model matrix.

BEST MODE FOR CARRYING OUT THE INVENTION

The following technology may be applied to a variety of wireless access systems using code division multiple access (CDMA), frequency division multiple access (FDMA), time division multiple access (TDMA), orthogonal frequency division multiple access (OFDMA), single carrier frequency division multiple access (SC-FDMA), and the like. CDMA may be embodied through radio technology such as universal terrestrial radio access (UTRA) or CDMA2000. TDMA may be embodied through radio technology such as global system for mobile communications (GSM)/general packet radio service (GPRS)/enhanced data rates for GSM evolution (EDGE). OFDMA may be embodied through radio technology such as institute of electrical and electronics engineers (IEEE) 802.11 (Wi-Fi), IEEE 802.16 (WiMAX), IEEE 802-20, and evolved UTRA (E-UTRA). UTRA is a part of a universal mobile telecommunications system (UMTS). 3rd generation partnership project (3GPP) long term evolution (LTE) is a part of evolved UMTS (E-UMTS) using E-UTRA. 3GPP LTE employs OFDMA in downlink and SC-FDMA in uplink. LTE-advanced (LTE-A) is an evolved version of 3GPP LTE.

For clarity of description, the following description focuses on the 3GPP LTE/LTE-A system. However, the technical features of the present invention are not limited thereto. Specific terms used in the following description are provided to aid in understanding the present invention. These specific terms may be replaced with other terms within the scope and spirit of the present invention.

Figure 1:
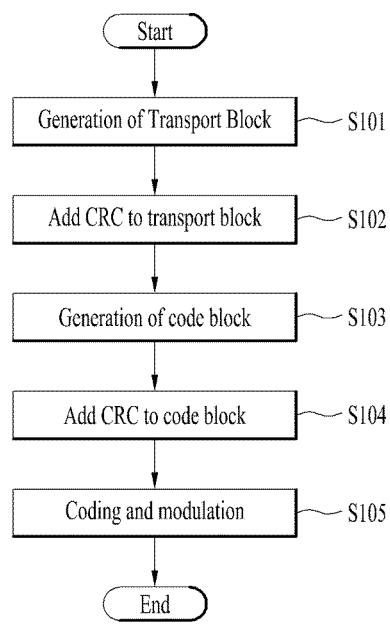
FIG. 1 is a flowchart illustrating an exemplary encoding procedure.

FIG. 1 is a flowchart illustrating an exemplary encoding procedure.

The encoding procedure as illustrated in FIG. 1 may be applied to numerous channel codes including a turbo code used in the LTE communication system. Hereinafter, for convenience of description, the encoding procedure will be described based on terms according to the standard specifications of the LTE communication system.

In the example of FIG. 1, a transmitter may generate a transport block (TB) (step S101). The transmitter adds a cyclic redundancy check (CRC) bit for the TB to the TB (step S102). The transmitter may generate code blocks from the TB to which the CRC bits are added (step S103). For example, the transmitter may segment the TB into the code blocks based on an input size of an encoder. The transmitter may add the CRC bits to each of the segmented code blocks (step S104). In this case, the size of the code block and the code block CRC bits may be 6144 bits. The transmitter may perform encoding and modulation with respect to each block which consists of a code block and code block CRC bits (step S105). For example, turbo coding may be applied as described previously.

A decoding procedure may be performed in a reverse order of the encoding procedure of FIG. 1. For example, a receiver may decode each code block using a decoder corresponding to each encoder, configure one final TB, and perform CRC confirmation for the TB.

For example, the size of an input symbol may be different from the size of a TB from a media access control (MAC) layer. If the size of the TB is greater than a maximum size of the input symbol of the turbo code, the TB may be segmented into a plurality of code blocks (CBs). According to standard of the LTE communication system, the size of the CB may be equal to a value obtained by subtracting the CRC bits from 6144 bits. The input symbol of the turbo code may be defined as data including a CB and a CRC or data including a TB (e.g., the size of the TB is less than 6144 bits) and a CRC. The CRC bits are significantly less than 6144 bits (e.g., the CRC bits are a maximum of 24 bits). Therefore, in the following description, a CB may refer to a CB itself or a CB and corresponding CRC bits and a TB may refer to a TB itself or a TB and corresponding CRC bits, unless defined otherwise).

Figure 2:
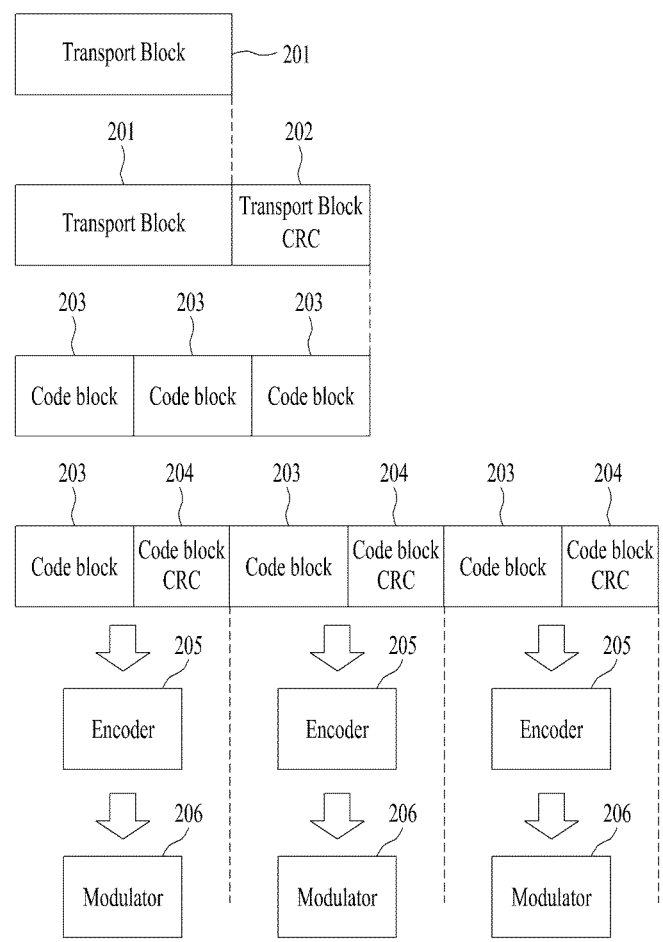
FIG. 2 is a diagram illustrating an exemplary transport block (TB) encoding procedure.

FIG. 2 is a diagram illustrating an exemplary TB encoding procedure.

FIG. 2 illustrates an encoding procedure of a TB 201 corresponding to the above-described encoding procedure in relation to FIG. 1. First, a TB CRC 202 is added to the TB 201. The TB CRC 202 may be used to confirm the TB 201 during a decoding procedure. Next, the TB 201 and the TB CRC 202 are divided into three CBs 203. In this embodiment, while the TB 201 and the TB CRC 202 are divided into the three CBs 203, the TB 201 may be divided into a plurality of CBs based on the input size of an encoder 205.

CB CRCs 204 are added to the respective CBs 203. The CB CRCs 204 may be used to confirm the CBs 203 by the receiver. The CBs 203 and the CB CRCs 204 may be encoded through respective encoders 205 and respective modulators 205.

Figure 3:
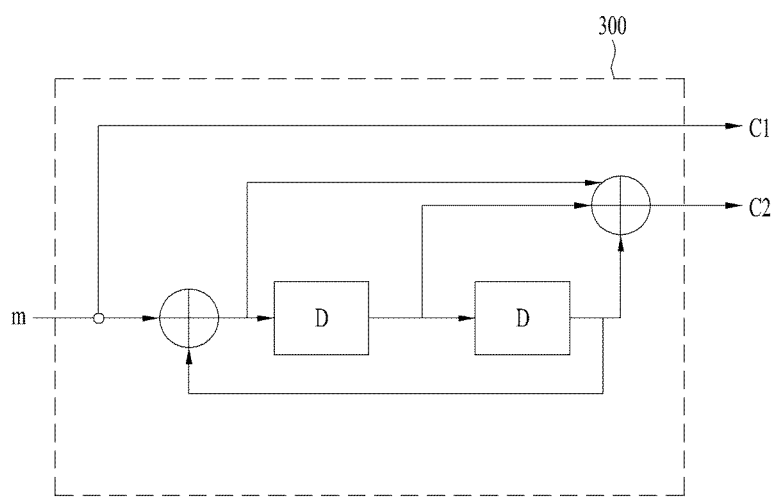
FIG. 3 is a diagram illustrating an exemplary recursive systematic convolutional (RSC) encoder.

FIG. 3 is a diagram illustrating an exemplary recursive systematic convolutional (RSC) encoder.

An RSC encoder 300 of FIG. 3 may be used for turbo coding. In FIG. 3, m denotes input data, C1 denotes a systematic bit stream, and C2 denotes a coded bit stream. Herein, the RSC encoder 300 has a code rate of 1/2.

The RSC encoder 300 may be configured by feeding back an encoded output to an input of a non-recursive, non-systematic convolutional encoder. In the embodiment of FIG. 3, the encoder 300 includes two delayers 301 and 302. A value D of each of the delayers 301 and 302 may be determined according to a coding scheme. The delayers 301 and 302 may be configured by memories or shift registers.

Figure 4:
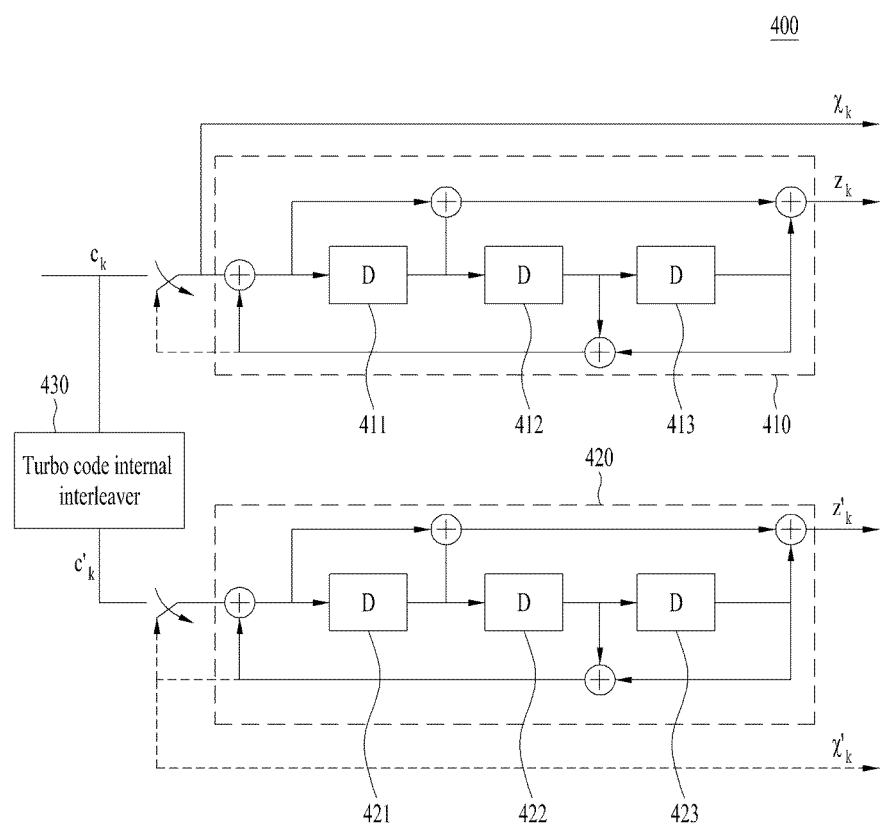
FIG. 4 is a diagram illustrating an LTE turbo encoder.

FIG. 4 is a diagram illustrating an LTE turbo encoder.

A coding scheme of an LTE turbo encoder 400 uses a parallel concatenated convolutional code (PCCC) implemented through two 8-state constituent encoders 410 and 420 and one turbo code internal interleaver 430.

In FIG. 4, the turbo encoder 400 includes the first constituent encoder 410, the second constituent encoder 420, and the turbo code internal interleaver 430. The first constituent encoder 410 and the second constituent encoder 420 are 8-state constituent encoders. Each of the first constituent encoder 410 and the second constituent encoder 420 has a structure similar to the RSC encoder of FIG. 3. The first constituent encoder 410 and the second constituent encoder 420 include three delayers 411, 412, and 413 and three delayers 421, 422, 423, respectively.

In FIG. 4, D denotes a value determined based on a coding scheme. $c_k$ denotes an input to the turbo encoder 400. Outputs from the first constituent encoder 410 and the second constituent encoder 420 are denoted as $z_k$ and $z'_k$, respectively. An output from the turbo code internal interleaver 430 is denoted as $c'_k$. Generally, each of the delayers 411, 412, 413, 421, 422, and 423 may delay an input value by one clock. However, each of the delayers 411, 412, 413, 421, 422, and 423 may be configured to delay the input value by more than one clock according to internal configuration. Each of the delayers 411, 412, 413, 421, 422, and 423 may be comprised of a shift register and may be configured so as to delay an input bit by a preset clock and then output the input bit therethrough.

The turbo code internal interleaver 430 may reduce an effect of a burst error which may be generated during signal transmission on a radio channel. For example, the turbo code internal interleaver 430 may be a quadratic polynomial permutation (QPP) interleaver.

A turbo code is a high-performance forward error correction (FEC) code used in the LTE communication system. For example, a data block coded by the turbo code may include three subblocks. One subblock may correspond to m-bit payload data. Another subblock may include n/2 parity bits for a payload, calculated using an RSC code. In addition, the other subblock may include n/2 parity bits for permutation of payload data, calculated using the RSC code. For example, the above permutation may be performed by the interleaver. Accordingly, the two different subblocks of parity bits may constitute one block together with the subblock for the payload. As an example, when m is equal to n/2, one block has a code rate of 1/3.

In the first constituent encoder 410, a procedure in which the input $c_k$ reaches the encoded bit $z_k$ may be divided into two paths. The two paths include a first path connected to an output stage from an input stage without feedback and a second path fed back from the input stage back to the input stage.

On the first path, the input $c_k$, the input $c_k$ passing through the delayer 411, and the input $c_k$ passing through the delayers 411, 412, and 413 are supplied to the output stage. A relationship between the input stage and the output stage for the first path may be expressed as a polynomial. The polynomial for the first path is referred to as a forward generator polynomial and may be expressed as g1 of the following equation indicated below.

$$g1(D)=1+D+D^3 \quad \text{[Equation 1]}$$

Meanwhile, on the second path, the input $c_k$, the input $c_k$ passing through the delayers 411 and 142, and the input $c_k$ passing through the delayers 411, 412, and 413 are fed back to the input stage. A polynomial for the second path is referred to as a recursive generator polynomial and may be expressed as g0 of the following equation indicated below.

$$g0(D)=1+D^2+D^3 \quad \text{[Equation 2]}$$

In Equations 1 and 2, "+" denotes exclusive OR (XOR) and 1 represents that an input is subjected to delay zero times. In addition, $D^n$ represents that an input is subjected to delay n times.

Figure 5:
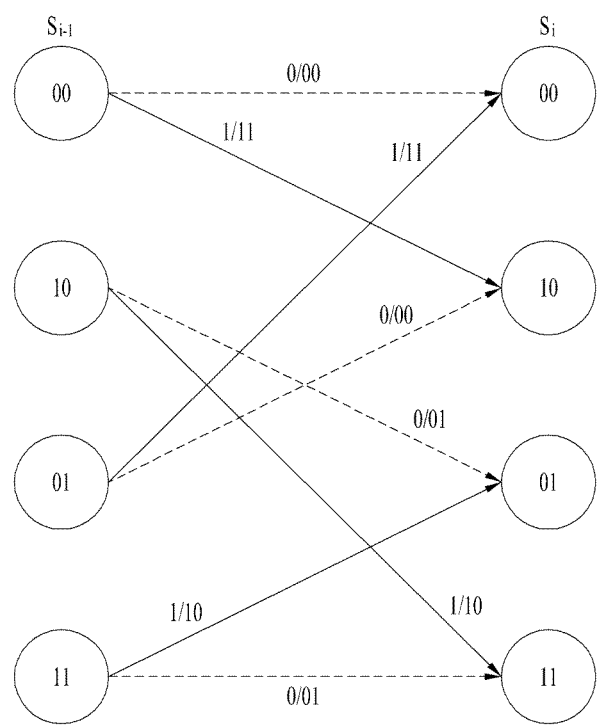
FIG. 5 is a diagram illustrating an exemplary trellis according to an RSC encoder.

FIG. 5 is a diagram illustrating an exemplary trellis according to an RSC encoder.

FIG. 5 illustrates the structure of the trellis of the RSC encoder of FIG. 3. In FIG. 5, $S_i$ denotes a state of i-th input data. In FIG. 5, each circle denotes a node. A line between nodes denotes a branch. A branch of a real line means a branch for an input value 1 and a branch of a dotted line means a branch for an input value 0. A value on the branch is expressed as m/C1C2 (input value/systematic bit, encoded bit). The trellis may have states exponentially proportional to the number of memories of the encoder. For example, if the encoder includes a memories, $2^a$ states may be included in the trellis.

The trellis is a state machine illustrating state transition of an encoder allowable two states. A convolutional encoder such as the RSC encoder may perform encoding according to a trellis diagram. A codeword encoded by the RSC encoder may be decoded according to an algorithm based on a trellis structure. For example, a Viterbi or Bahl, Cocke, Jelinek and Raviv (BCJR) algorithm may be used.

Figure 6:
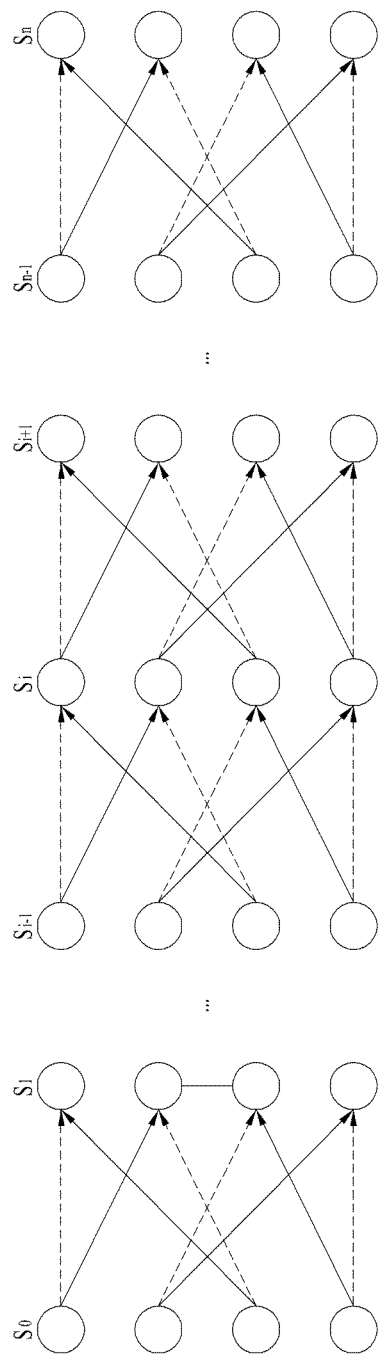
FIG. 6 is a diagram illustrating an exemplary trellis structure.

FIG. 6 is a diagram illustrating an exemplary trellis structure.

In FIG. 6, n denotes the length of a codeword. Typically, additional bits are added to the end of an input sequence, thereby terminating a trellis. Generally, a sequence consisting of 0s is referred to as tail bits. The tail bits terminate the trellis by causing nodes of one state of the trellis to have a value of 0.

In FIG. 6, the length of the codeword may be determined in consideration of the length k of input data and the length t of tail bits. For example, when a code rate is R, the length n of the codeword may have a value of (k+t)/R. Generally, the length t of the tail bits may be determined as a length with which all delays (e.g., memories) of an encoder can be reset. As an example, the RSC encoder of FIG. 3 may use a total of two tail bits. In addition, the turbo encoder of LTE communication as illustrated in FIG. 4 may use three tail bits.

The tail bits have a relatively short length as compared with the length of input data. As described above, since the length of the codeword is associated with the length of the tail bits, if the length of the codeword is limited, code rate loss may occur due to the tail bits. However, although code rate loss is generated due to the tail bits, trellis termination using the tail bits is widely used because of low complexity of calculation and excellent error correction performance.

Puncturing is a scheme of puncturing a part of codewords. Through puncturing, since a part of codewords is punctured, partial codewords are not transmitted. For example, puncturing may be used to reduce code rate loss caused by addition of the tail bits. In this case, a receiver may perform decoding using a trellis corresponding to the sum of the length k of the input data and the length t of the tail bits. That is, the receiver may perform decoding under the assumption that the receiver has received codewords which are not punctured. In this case, the receiver may regard a branch from a node corresponding to a punctured bit (i.e., a bit which is not transmitted by a transmitter) as having no input value. That is, it is assumed that the input data for branches of a corresponding node is 0 or 1 with the same possibility.

As described above in relation to FIG. 1, a CRC for a CB is added to the CB. The CRC may be determined as a remainder derived after data to be transmitted is divided by a preset check value used as a divisor. Generally, the CRC may be added to the end of the transmission data. The receiver may compare the remainder after reception data is divided by the preset check value with the CRC or determine whether a remainder after entire reception data including the CRC is divided by the check value is 0.

If the size of a TB is 6144 bits, the size of the CRC may be a maximum of 24 bits. Accordingly, the other bits except for the CRC bits may be determined as the size of the CB.

The receiver may perform decoding with respect to each CB. Thereafter, the receiver may configure the TB from CBs and determine whether decoding has been successfully performed by checking the CRC for the TB. In a current LTE system, a CB CRC is used for early decoding termination. For example, if a CRC for one CB fails, the receiver may not decode the other CBs and transmit a negative acknowledgement (NACK) to the transmitter.

Upon receiving NACK, the transmitter may retransmit at least a part of transmission data. For example, the transmitter may retransmit a TB or one or more CBs. As an example, when the transmitter retransmits all of the TB, radio resources for retransmission may be excessively consumed. In addition, for example, when the receiver generates NACK due to failure of a CB CRC, the receiver may transmit information about a CB (e.g., an index of a CB) in which CRC failure has occurred to the transmitter. The transmitter may increase the efficiency of radio resources by transmitting only the CB in which CRC failure has occurred using the information about the CB. However, if the number of CBs increases, the amount of data for feeding back the information about the CBs (e.g., indexes of the CBs) increases.

In the LTE communication system, the receiver may inform the transmitter through an ACK/NACK signal whether data has been successfully received. In the case of frequency division duplex (FDD), ACK/NACK for data received in an i-th subframe is transmitted in an (i+4)-th subframe. If NACK is received in the (i+4)-th subframe, retransmission may be performed in an (i+8)-th subframe. This is to consider a time for processing the TB and a time for generating ACK/NACK because channel code processing for processing the TB consumes much time. In the case of time division duplex (TDD), ACK/NACK and retransmission subframes may be determined based on a time for processing the TB, a time for generating ACK/NACK, and uplink subframe allocation (e.g., TDD uplink/downlink configuration). In addition, ACK/NACK bundling and multiplexing may be used.

As described above, the turbo code shows restricted improvement in an error rate if an SNR exceeds a predetermined value. As an alternative to the turbo code, a low-density parity-check (LDPC) code has been proposed. The LDPC code is a linear block code and is used in IEEE 802.11n and 802.11ac and digital video broadcasting (DVB). The LDPC code may include a generation matrix and a parity check matrix. In the LDPC code, data may be encoded through a multiplication operation of message bits and the generation matrix. Generally, in communication specification using the LDPC code, the parity check matrix may be used instead of the generation matrix. For example, data may be encoded using the parity check matrix.

The linear block code may be generated based on a generation matrix G or a parity check matrix H. The linear block code is configured such that the product $Hc^t$ of a transpose matrix of a codeword c and the parity check matrix has a value of 0 with respect to the whole codeword c. Decoding of the LDPC code may be performed, as identical to other linear block codes, by checking whether the product of the parity check matrix H and the codeword c is '0'. For example, decoding of the LDPC code may be performed by checking whether the product (i.e., $Hc^t$) of a transpose matrix of the codeword c and the parity check matrix is 0.

In the LDPC code, most elements of the parity check matrix are 0 and there are a small number of elements having values other than 0 as compared with the length of the code. Therefore, the LDPC code may perform iterative decoding based on probability. In an initially proposed LDPC code, the parity check matrix has been defined in a non-systematic form and a small weight has been uniformly applied to rows and columns of the parity check matrix. A weight may mean the number of 1s included in a row or a column.

As described above, the density of elements having values other than 0 in a parity check matrix H of the LDPC code is low. Accordingly, the LDPC code has performance approximating to limits of Shannon's theorem while decoding complexity is kept low. Due to high error correction performance and low decoding complexity of this LDPC code, the LDPC code is suitable for high-speed wireless communication.

Hereinafter, a structured LDPC code will be described.

Figures 7, 8:
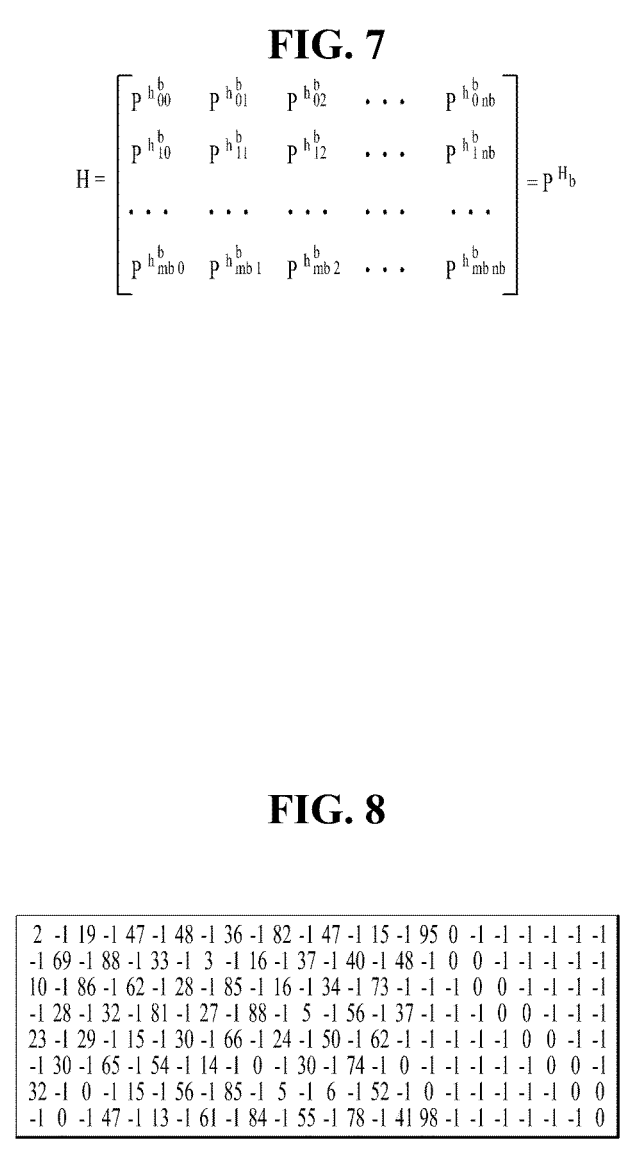

As described previously, the parity check matrix H may be used to generate the LDPC code. The matrix H includes a large number of 0s and a small number of 1s. The size of the matrix H may be $10^5$ bits or more. Many memories may be needed to express the H matrix. In the structured LDPC code, elements of the matrix H may be expressed as subblocks of a predetermined size as illustrated in FIG. 7. In FIG. 7, each of the elements of the matrix H represents one subblock.

In the IEEE 802.16e standard specification, a subblock is indicated by one integer index, so that the size of memories for expressing the matrix H may be reduced. Each subblock may be, for example, a permutation matrix of a predetermined size.

FIG. 8 is a diagram illustrating an exemplary model matrix.

For example, referring to the IEEE 802.16e standard specification, if the size of codewords is 2304 and a code rate 2/3, a model matrix used to encode/decode the LDPC code is as illustrated in FIG. 8. The model matrix may mean a parity check matrix including at least one subblock described below. The subblock may be referred to as the number of shifts in the following description. The model matrix may be extended to the parity check matrix based on a method which will be described later. Therefore, encoding and decoding based on a specific model matrix means encoding and decoding based on a parity check matrix generated by extending the model matrix.

In FIG. 8, index '−1' indicates a zero matrix of a preset size. Index '0' indicates an identity matrix of a preset size. A positive index except for '−1' and '0' indicates the number of shifts. For example, a subblock expressed as index '1' may mean a matrix obtained by shifting an identity matrix once in a specific direction.

Figures 9, 10:
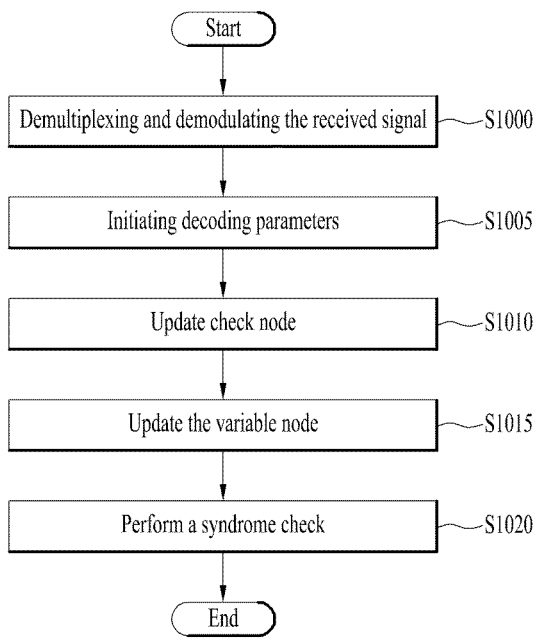
FIG. 9 is a diagram referenced to explain matrix transformation according to the number of shifts.
FIG. 10 is a flowchart illustrating an exemplary LDPC code decoding method.

FIG. 9 is a diagram referenced to explain matrix transformation according to the number of shifts.

For example, FIG. 9 illustrates the case in which the size of a subblock is 4 rows and 4 columns. In FIG. 9, the subblock is shifted from an identity matrix three times to the right. In this case, in a parity check matrix of a structured LDPC code, the subblock may be represented using an integer index of '3'.

Generally, encoding of the LDPC code may be performed by generating a generation matrix G from a parity check matrix H and encoding information bits using the generation matrix. To generate the generation matrix G, Gaussian reduction is performed with respect to the parity check matrix H to configure a matrix in the form of $[P^T:I]$. If the number of the information bits is k and the size of encoded codewords is n, a matrix P is a matrix including k rows and n-k columns and a matrix I is an identity matrix having a size of k.

If the parity check matrix H has the form of $[P^T:I]$, the generation matrix G has a form of $[I:P^T]$. If k information bits are encoded, the encoded information bits may be expressed as a matrix x of one row and k columns. In this case, a codeword c is xG having a form of [x:xP]. Herein, x denotes an information part (or a systematic part) and xP denotes a parity part.

In addition, the information bits may be encoded directly from the matrix H without deriving the matrix G by designing the matrix H as a specific structure without using Gaussian reduction. For the structures of the above-described matrix H and matrix G, the product of the matrix G and a transpose matrix of the matrix H has a value of 0. Using such a characteristic and a relationship between the information bits and the codeword, the codeword may be obtained by adding parity bits to the end of the information bits.

FIG. 10 is a flowchart illustrating an exemplary LDPC code decoding method.

In a communication system, encoded data includes noise in a process of passing through a radio channel. Accordingly, a codeword c is expressed as a codeword c' including noise in a receiver. The receiver performs demultiplexing and demodulation with respect to a received signal (step S1000) and initializes decoding parameters (step S1005). The receiver updates a check node and a variable node (steps S1010 and S1015) and performs syndrome check (step S1020). That is, a decoding procedure may be ended by checking whether $c'H^T$ is 0. If $c'H^T$ is 0, the first k bits from c' may be determined as the information bits x. If $c'H^T$ is not 0, the information bit x may be recovered by searching for c' satisfying the condition that $c'H^T$ is 0 based on a decoding scheme such as a sum-product algorithm.

Figure 11:
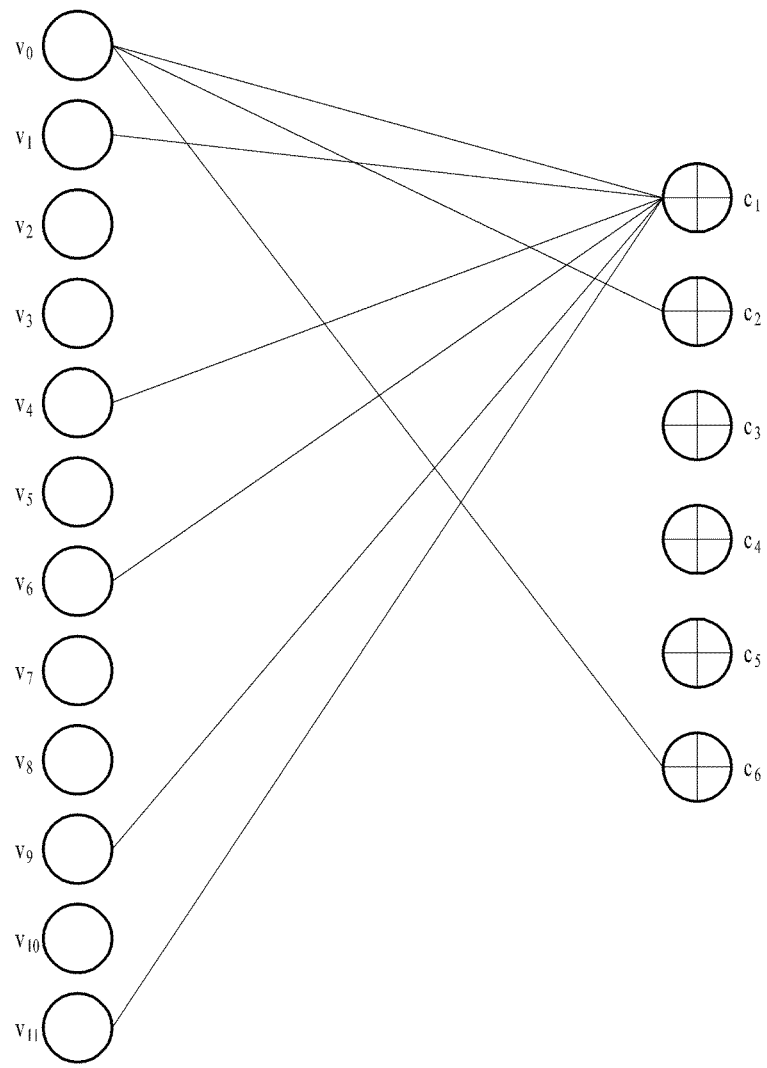
FIG. 11 is a diagram illustrating an exemplary bipartite graph.

FIG. 11 is a diagram illustrating an exemplary bipartite graph.

In FIG. 11, left nodes $v_0, v_1, \ldots, v_{11}$ represent variable nodes and right nodes $c_1, c_2, \ldots, c_6$ represent check nodes. In the example of FIG. 11, a bipartite graph is illustrated focusing on the variable node $v_0$ and check node $c_1$ for convenience of description. Connection lines of the bipartite graph of FIG. 11 may be referred to as edges. The bipartite graph of FIG. 11 may be generated from Hc'. Therefore, in FIG. 11, edges from the variable node $v_0$ correspond to the first column of the parity check matrix H and edges from the check node $c_1$ correspond to the first row of the matrix H.

As described above, in order to successfully perform decoding, the product of the parity check matrix H and a transpose matrix of the codeword matrix c should have a value of '0'. Accordingly, values of variable nodes connected to one check node should be 0. Consequently, in FIG. 11, values of exclusive OR (XOR) of the variable nodes $v_0, v_1, v_4, v_6, v_9, v_{11}$ connected to the check node c1 should be '0'. Syndrome check means checking as to whether a value of XOR of variable nodes connected to each check node is 0.

In an enhanced mobile broadband (eMBB) communication environment, the LDPC code may be used. For example, the LDPC code may be used for a data channel. In relation thereto, an LDPC code decoding method code using syndrome check instead of CRC has been proposed. However, when syndrome check is performed during repeated decoding, a memory in which a log likelihood ratio for variable nodes is stored needs to be read every time for syndrome check. Therefore, power consumption and latency caused by memory reading may increase.

A sum-product algorithm is used as a standard decoding algorithm for a capacity-approaching code (e.g., a turbo code or an LDPC code). As a decoding method using the sum-product algorithm, a belief propagation algorithm is used. In a layered belief propagation algorithm, operations for check nodes and variable nodes of the sum-product algorithm are sequentially processed for decoding of the LDPC code. Therefore, in the layered belief propagation algorithm, a probability value of the first variable node is transferred to check nodes connected to the first variable node and an additional information value calculated based on the probability value transferred to each check node is transferred to variable nodes connected to each check node. Update for the other variable nodes is sequentially performed based on the transferred additional information value. Thus, probability values for all variable nodes may be updated.

Due to sequential update of the variable nodes the layered belief propagation algorithm, a probability value of an already updated variable node may be used for update of a specific variable node. However, decoding using the layered belief propagation algorithm is disadvantageous in that a decoding time increases relative to a flooding belief propagation algorithm by the length of a codeword. For example, the decoding time may increase by N times the length of the codeword.

Figure 12:
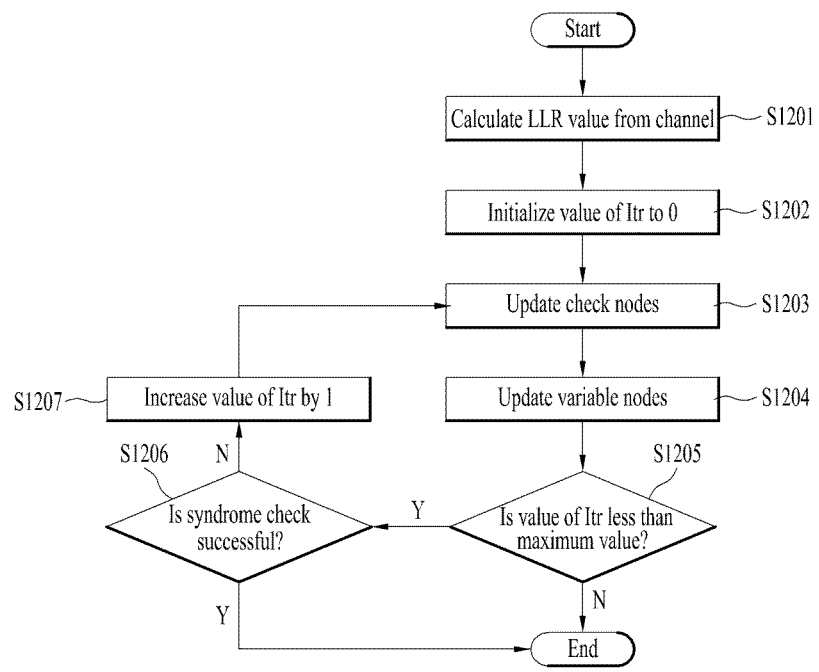
FIG. 12 illustrates an exemplary LDPC code decoding method using syndrome check.

FIG. 12 is a flowchart of an exemplary LDPC code decoding method using syndrome check.

A receiver calculates a log likelihood ratio (LLR) value from a channel (S1201). For example, the receiver may calculate an LLR value of a received input signal or a codeword. Although not illustrated in FIG. 12, the receiver may initialize variable nodes using the LLR value. In addition, the receiver initializes a value of a parameter Itr to 0 (S1202). The parameter Itr is a parameter indicating the number of repetitions. The receiver updates respective check nodes based on values of the variable nodes (S1203). For example, the respective check nodes may be updated based on the values of the variable nodes associated with the respective check nodes by a parity check matrix. The receiver may update the variable nodes (S1204). For example, the receiver may update the respective variable nodes based on values of the check nodes (e.g., LLR values of the check nodes) associated with the variable nodes by the parity check matrix.

The receiver determines whether the value of the parameter Itr is less than a preset maximum value (S1205). If the value of the parameter Itr is less than the maximum value, the receiver may determine whether syndrome check is successful (S1206). For example, the receiver may perform syndrome check for the check nodes using the parity check matrix. For example, syndrome check may be performed according to the method described with reference to FIGS. 9 to 11. If syndrome check is successful, decoding may be regarded as successful. Then, decoding may be ended. However, if syndrome check fails, the receiver may increase the value of the parameter Itr by 1 and repeat steps S1203 to S1205. However, when the number of repetitions reaches the preset maximum value, the receiver may regard decoding as failed. For example, if decoding fails, the receiver may end decoding and transmit negative acknowledgement (NACK) and/or a retransmission request to a transmitter.

Figure 13:
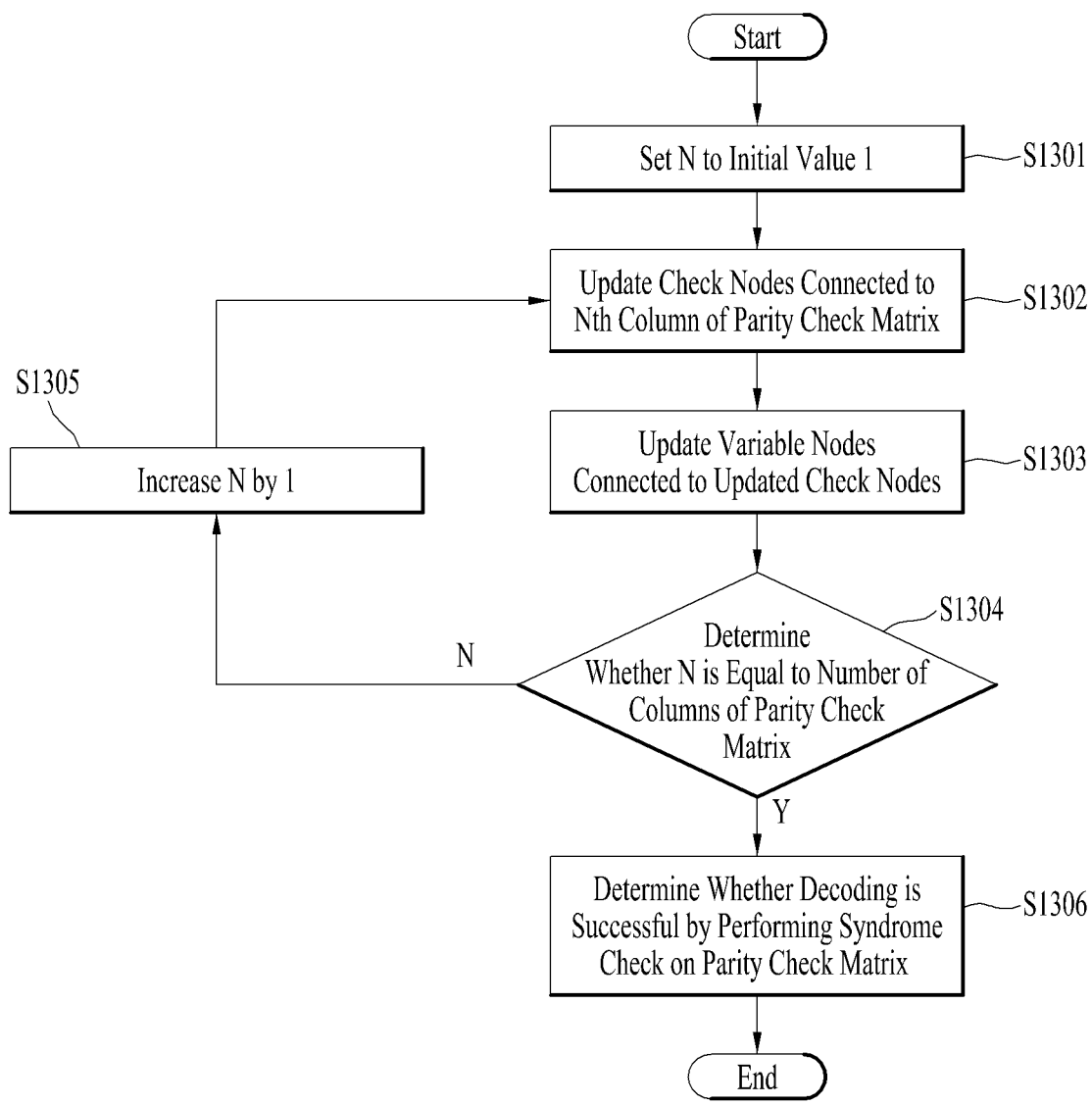
FIG. 13 is a flowchart illustrating a syndrome check method according to an example.

FIG. 13 is a flowchart illustrating a syndrome check method according to an example.

Referring to FIG. 13, the syndrome check method will be described below in detail. The syndrome check method illustrated in FIG. 13 may correspond to step S1206 of FIG. 12.

First, the receiver may set a parameter N to an initial value, 1 (S1301). Then, the receiver may update check nodes connected to an $N^{th}$ column of a parity check matrix (S1302). That is, the receiver may update the values of check nodes corresponding to elements having a value of 1 in the $N^{th}$ column of the parity check matrix. Further, the receiver may update variable nodes connected to the updated check nodes (S1303).

Subsequently, the receiver may determine whether the value of N is equal to the number of columns of the parity check matrix (S1304). If the value of N is less than the number of columns of the parity check matrix, the receiver may increase the value of N by 1 (S1305) and repeat steps S1302 to S1304. Accordingly, check nodes and variable nodes corresponding to all columns of the parity check matrix may be sequentially updated.

If the value of N is equal to the number of columns of the parity check matrix, the receiver may determine whether decoding is successful by performing syndrome check on the parity check matrix (S1306). For example, the receiver may perform syndrome check by using a hard-decision LLR values for the check nodes.

As described above with reference to FIGS. 12 and 13, therefore, all nodes are subjected to update and syndrome check at every iteration. Accordingly, power consumption and time for memory reading and processing may be increased.

Now, a decoding method which may reduce power consumption and decoding time will be described.

Figure 14:
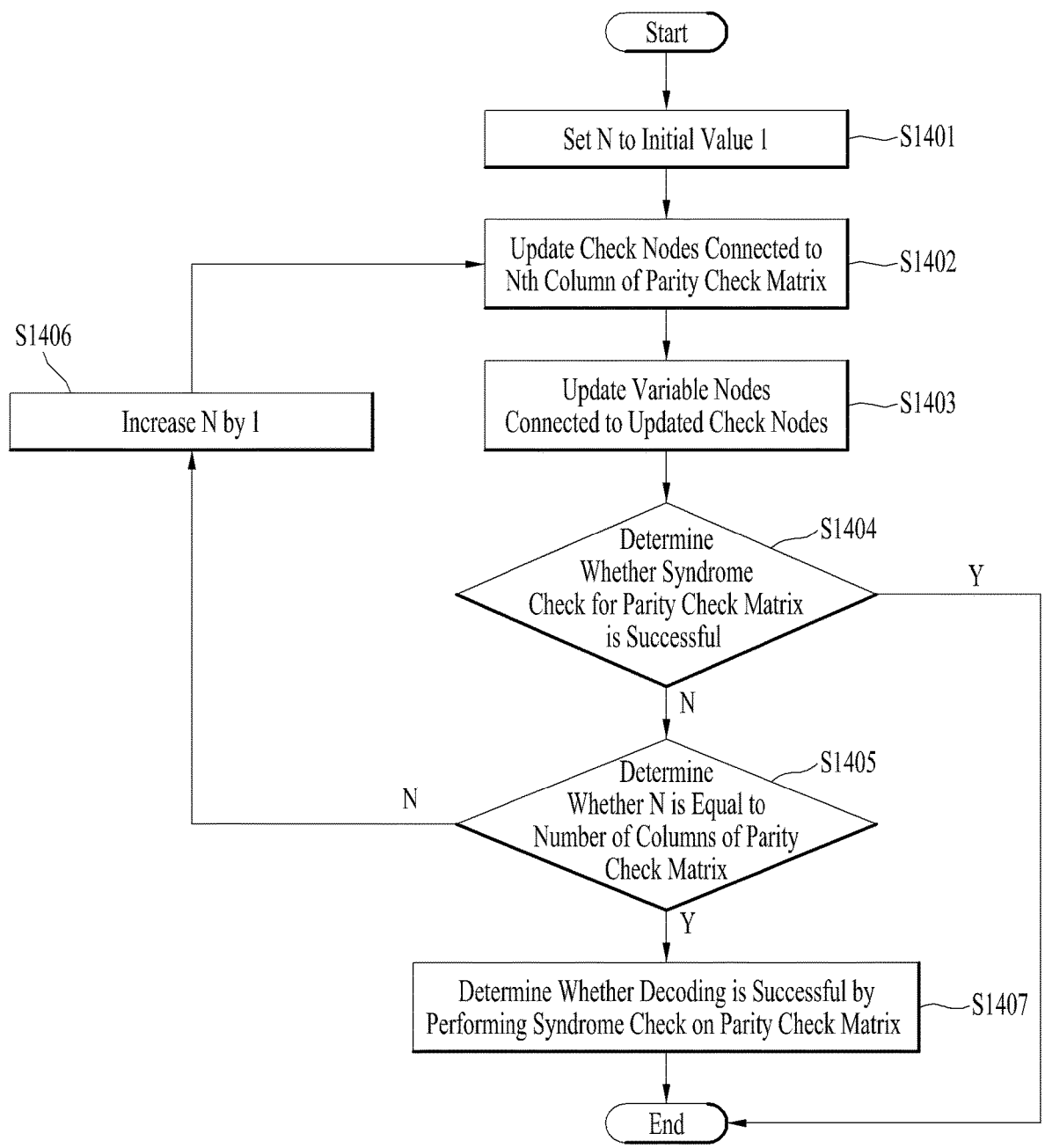
FIG. 14 is a flowchart illustrating a syndrome check method according to an embodiment.

FIG. 14 is a flowchart illustrating a syndrome check method according to an embodiment.

The syndrome check method of FIG. 14 may correspond to step S1206 of FIG. 12.

First, the receiver may set the parameter N to an initial value, 1 (S1401). The receiver may then update the check nodes connected to the $N^{th}$ column of the parity check matrix (S1402). That is, the receiver may update the values of check nodes corresponding to elements having a value of 1 in the $N^{th}$ column of the parity check matrix. In addition, the receiver may update variable nodes connected to the updated check nodes (S1403).

Unlike the example of FIG. 13, after updating the variable nodes (S1403), the receiver determines whether the syndrome check for the parity check matrix is successful (S1404) in the present embodiment. Unlike the example of FIG. 13, the syndrome check is performed before the check nodes and variable nodes for the entire parity check matrix are updated. Therefore, even before the check nodes and variable nodes for all columns of the parity check matrix are updated, the receiver may determine that the decoding is successful and terminate the decoding, if the syndrome check is successful. Therefore, time and power consumption for decoding may be reduced.

If the syndrome check is failed in step S1404, the receiver may determine whether the value of N is equal to the number of columns of the parity check matrix (S1405). If the value of N is less than the number of columns of the parity check matrix, the receiver may increase the value of N by 1 (S1406) and repeat steps S1402 to S1405. Accordingly, check nodes and variable nodes corresponding to all columns of the parity check matrix may be sequentially updated.

If the value of N is equal to the number of columns of the parity check matrix, the receiver may determine whether the decoding is successful by performing syndrome check on the parity check matrix (S1407). For example, the receiver may perform syndrome check by using hard-decision LLR values for the check nodes.

In FIG. 14, step S1407 may be omitted. This is because the syndrome check has already been performed in step S1404. In this case, it may be determined whether the decoding is successful in step S1404.

Figure 15A:
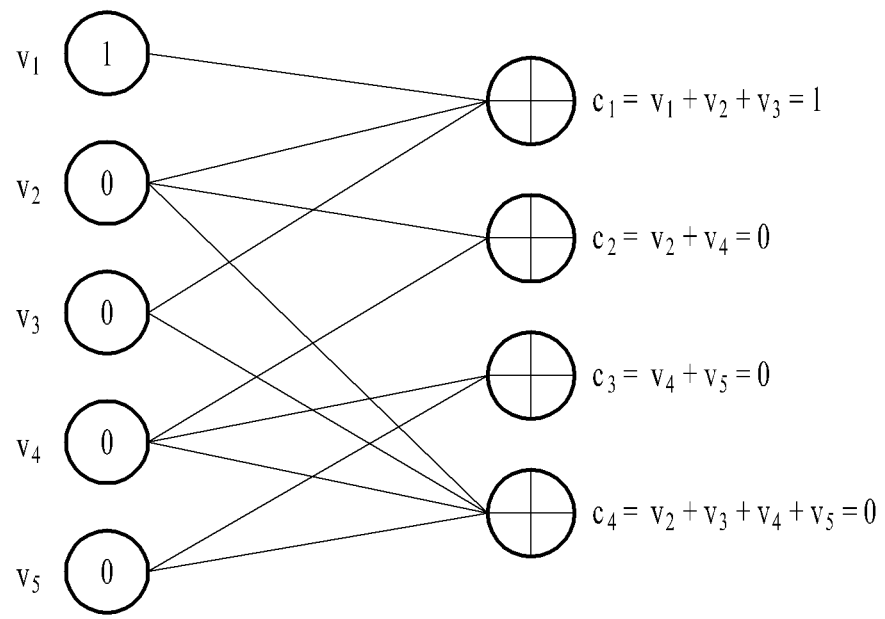
FIGS. 15a and 15b are diagrams illustrating a syndrome check method according to an embodiment.
Figure 15B:
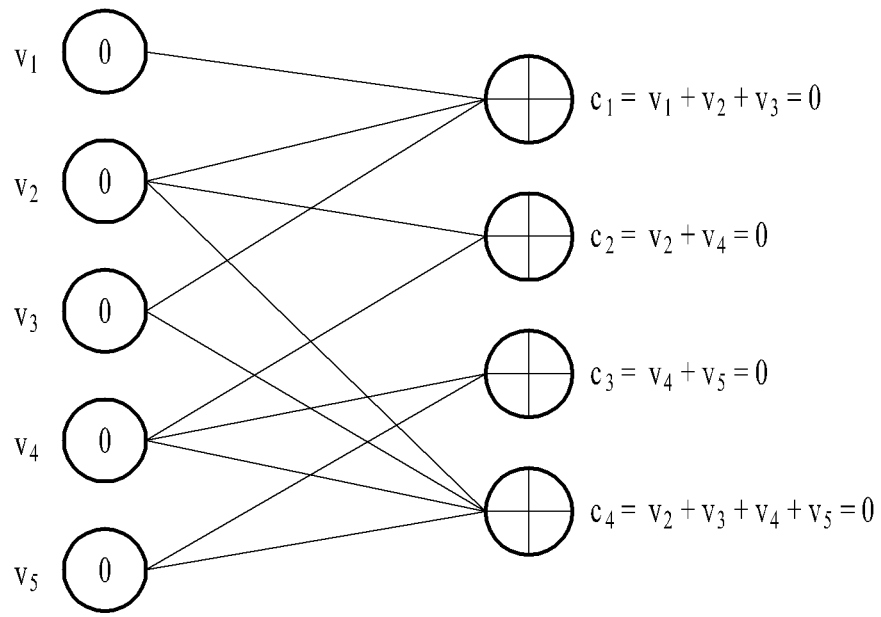

FIGS. 15a and 15b are diagrams illustrating a syndrome check method according to an embodiment.

FIGS. 15a and 15b are bipartite graphs according to an embodiment. In FIGS. 15a and 15b, the left nodes represent variable nodes $v_1$, $v_2$, $v_3$, $v_4$, and $v_5$, and the right nodes represent check nodes $c_1$, $c_2$, $c_3$, and $c_4$. Further, the numbers in the variable nodes $v_1$, $v_2$, $v_3$, $v_4$, and $v_5$ represent the current values of the variable nodes. Further, syndrome check may be performed on the check nodes $c_1$, $c_2$, $c_3$, and $c_4$ by XOR-operating the values of the variable nodes $v_1$, $v_2$, $v_3$, $v_4$, and $v_5$ connected to the check nodes $c_1$, $c_2$, $c_3$, and $c_4$. In FIGS. 15a and 15b, "+" may represent an XOR operation.

For the syndrome check, each variable node and each check node are sequentially updated, as described above with reference to FIGS. 13 and 14. For example, decoding may be performed again because of failure in syndrome check during the previous decoding. In this case, the data may be sequentially updated from the variable node $v_1$. FIG. 15a is a bipartite graph before the variable node $v_1$ is updated. In FIG. 15a, the values of the variable nodes $v_1$, $v_2$ and $v_3$ are XOR-operated at the check node $c_1$. In FIG. 15a, the value of the check node $c_1$ is 1.

FIG. 15b is a bipartite graph in which the first variable node $v_1$ and the check node $c_1$ connected to the first variable node $v_1$ are updated. Along with the sequential update of the variable nodes, the value of the variable node $v_1$ is updated to 0 in FIG. 15b. In addition, check nodes connected to the updated variable node are updated. In FIG. 15b, the variable node $v_1$ is connected only to the check node $c_1$. Thus, only the value of the check node $c_1$ is updated. As illustrated in FIG. 15b, after the update, all of the check nodes $c_1$, $c_2$, $c_3$, and $c_4$ have a value of 0.

As described above, since the syndrome check has been performed for all the check nodes in the previous decoding, the receiver may know syndrome values for the remaining check nodes other than the updated check node. Accordingly, the receiver may confirm that the syndrome value of every check node is 0, and may terminate the decoding.

For example, a flag bit for each check node may be set. For example, a flag may be set for a check node with a non-zero syndrome value (i.e., a check that has failed in syndrome check) in the previous decoding step. Further, when the syndrome value of the check node becomes 0 according to the update of the variable node, the corresponding flag may be released. Accordingly, the receiver may perform syndrome check without checking syndrome values for all the check nodes by checking only the syndrome value for the check node for which the flag is set.

Meanwhile, the conventional syndrome check method described above with reference to FIG. 13 continuously updates the remaining variable nodes and check nodes. Therefore, the conventional syndrome check method increases time and power consumption for decoding, since the receiver performs syndrome check after all the variable nodes and the check nodes are updated.

Figure 16A:
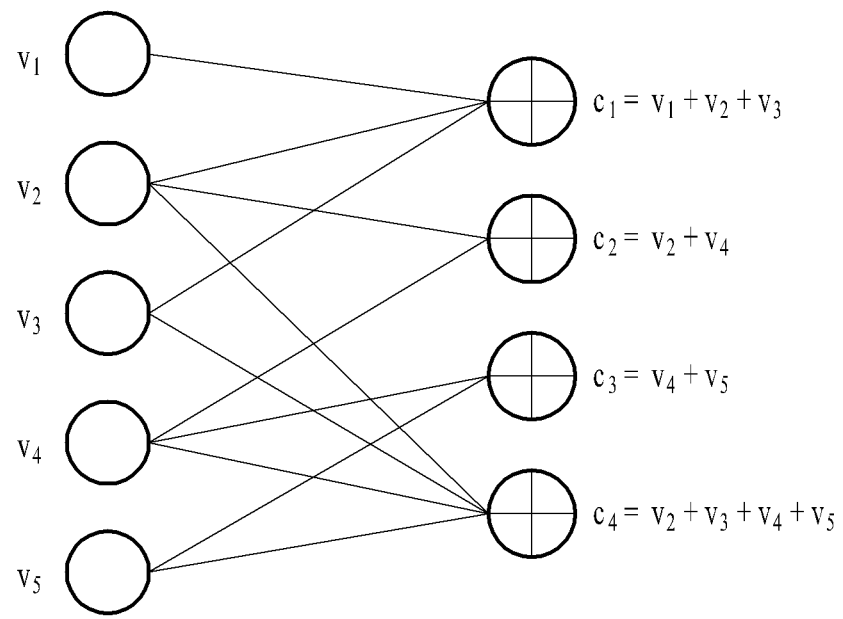
FIGS. 16a and 16b are diagrams illustrating a hierarchical LDPC decoding method according to an embodiment.
Figure 16B:
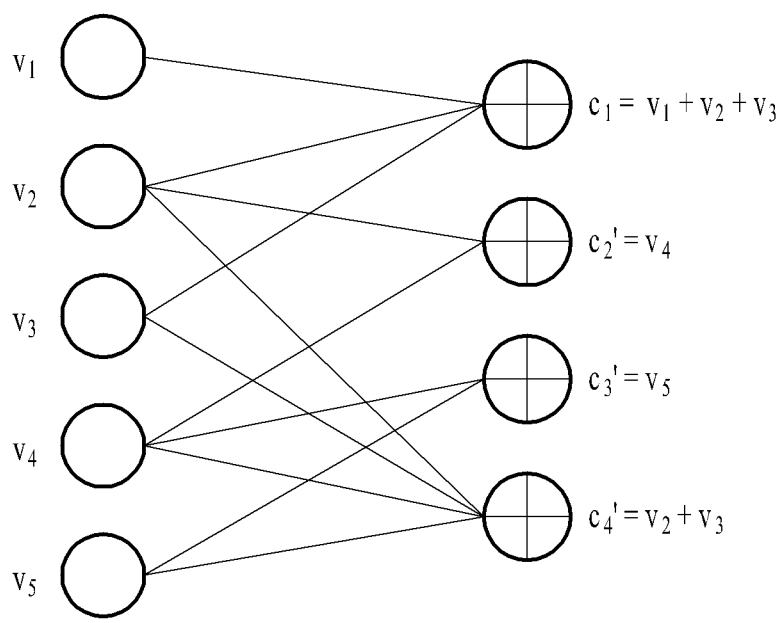

FIGS. 16a and 16b are diagrams illustrating a hierarchical LDPC decoding method according to an embodiment.

FIGS. 16a and 16b are bipartite graphs according to an embodiment. In FIGS. 16a and 16b, the left nodes are variable nodes $v_1$, $v_2$, $v_3$, $v_4$, and $v_5$, and the right nodes are check nodes $c_1$, $c_2$, $c_3$, and $c_4$. In addition, syndrome check may be performed for the check nodes $c_1$, $c_2$, $c_3$, and $c_4$ by XOR-operating the values of the variable nodes $v_1$, $v_2$, $v_3$, $v_4$, and $v_5$ connected to the check nodes $c_1$, $c_2$, $c_3$, and $c_4$. "+" may represent an XOR operation in FIGS. 16a and 16b.

In FIG. 16a, in order to update a check node, a memory corresponding to all variable nodes connected to the check node needs to be read. Referring to FIG. 16a, when the variable node $v_4$ is updated, the connected check nodes $c_2$, $c_3$, and $c_4$ are updated. For example, to calculate the syndrome value of the updated check node $c_4$, the memory corresponding to the variable nodes $v_2$, $v_3$, $v_4$, and $v_5$ needs to be read.

In order to reduce the number of memory reads for updating a check node, relational expressions for determining syndrome values different from those in FIG. 16a may be used. Referring to FIG. 16b, a relational expression for determining a syndrome value of a check node may be modified not to include a variable node connected to a check node before the check node.

In FIG. 16b, the syndrome value of $c_2'$ is determined by XOR-operating the values of variable nodes that do not overlap with the check node $c_1$. For example, a set of variable nodes connected to the previous check node may be referred to as a first set. In addition, a set of variable nodes connected to the check node subsequent to the previous check node may be referred to as a second set. In this case, the syndrome value of the modified subsequent check node may be determined by variable nodes included in the difference of the first set from the second set.

In FIG. 16b, since the check node $c_1$ is the first node, it has the same relational expression as that in FIG. 16a. However, the check node $c_2'$ has a relational expression in which the variable node $v_2$ is removed from that in FIG. 16a.

Referring to FIG. 16b, for example, the variable node $v_4$ is updated. In this case, the check nodes $c_2'$, $c_3'$, and $c_4'$ connected to the variable node $v_4$ are updated. According to the modified relational expressions of FIG. 16b, the variable nodes connected to the check nodes $c_2'$, $c_3'$, and $c_4'$ are $v_4$, $v_5$, $v_2$, and $v_3$, respectively.

Figure 17A:
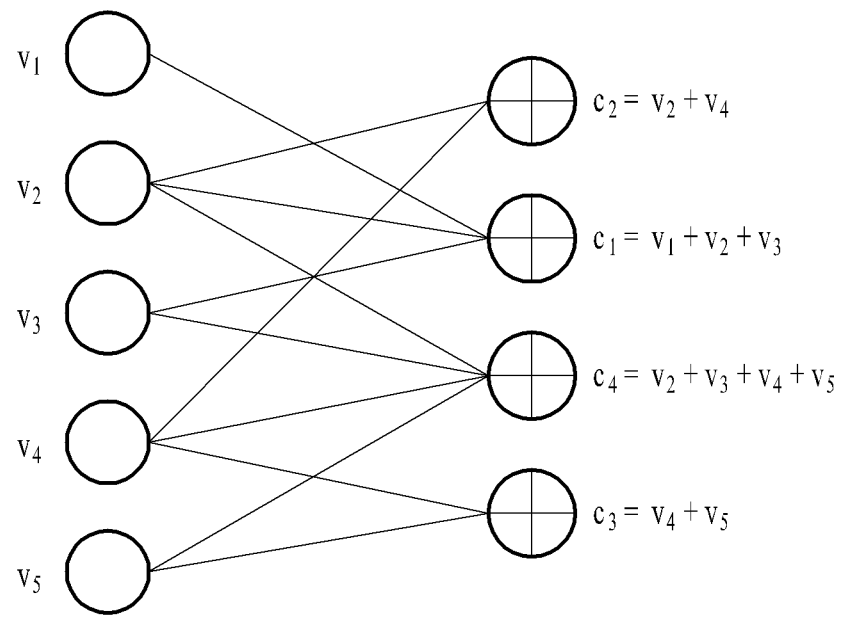
FIGS. 17a and 17b are diagrams illustrating a hierarchical LDPC decoding method according to another embodiment.
Figure 17B:
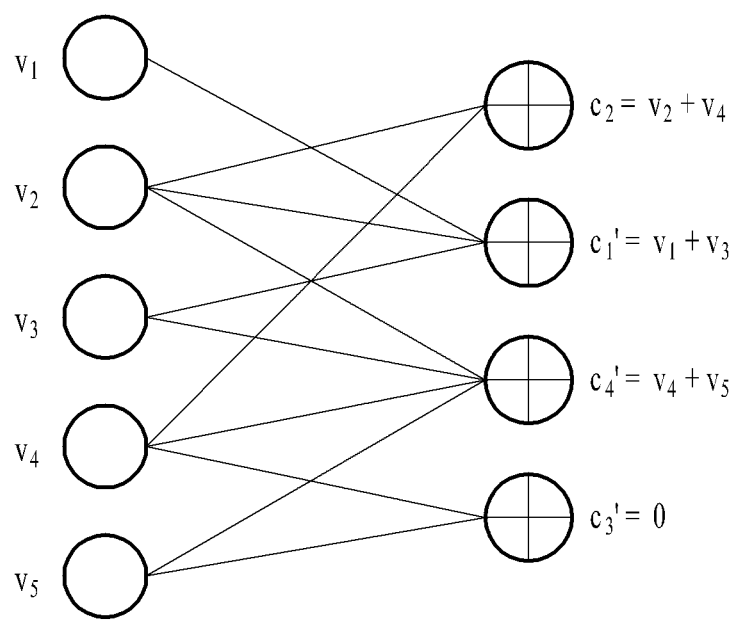

FIGS. 17a and 17b are diagrams illustrating a hierarchical LDPC decoding method according to another embodiment.

FIGS. 17a and 17b are bipartite graphs according to an embodiment. In FIGS. 17a and 17b, the left nodes are variable nodes $v_1$, $v_2$, $v_3$, $v_4$, and $v_5$, and the right nodes are check nodes $c_1$, $c_2$, $c_3$, and $c_4$. In addition, syndrome check may be performed for the check nodes $c_1$, $c_2$, $c_3$, and $c_4$ by XOR-operating the values of the variable nodes $v_1$, $v_2$, $v_3$, $v_4$, and $v_5$ connected to the check nodes $c_1$, $c_2$, $c_3$, and $c_4$. "+" may represent an XOR operation in FIGS. 17a and 17b.

In FIG. 17a, the order of check nodes illustrated in FIG. 16a is changed. This is done to minimize the number of variable nodes for calculating the syndrome values of the check nodes. The method of modifying relational expressions as described above with reference to FIG. 16B may be applied to the check nodes of which the order has been changed in FIG. 17a. That is, the changed check nodes may remove variable nodes that overlap with their previously located check nodes from their relational expressions.

FIG. 17b illustrates modified relational expressions according to the method described above in relation to FIG. 17a. In the case of the modified relational expression for the check node $c_3'$, the check node $c_3'$ is not connected to any variable node. Therefore, the following effects may be obtained by reducing the number of variable nodes connected to the check nodes as illustrated in FIG. 17b. As described above, for syndrome check on each check node, the value of each variable node connected to each syndrome check is read from the memory. Thus, the number of memory reads may be reduced by reducing the number of variable nodes connected to each check node. Considering that power consumption for memory reads in a decoder has a relatively high proportion, this may greatly reduce the power consumption of the memory. In addition, decoding time and delay may be reduced by reducing the number of memory reads. Further, a pipeline may be used, for example, to reduce the decoding delay. When the pipeline is used, an updated value is used for decoding after the variable nodes connected to the check node are completely updated. In this case, the decoding time and delay may be further reduced.

In the illustrated case of FIG. 17a, for example, when the variable node $v_1$ is updated, the syndrome value of the check node $c_1$ connected to the variable node $v_1$ may be checked. Thus, the values of the variable nodes $v_1$, $v_2$, and $v_3$ connected to the check node $c_1$ are read. As such, updating one variable node requires reading the values of all the variable nodes associated with the check node connected to the corresponding variable node. In the case of FIG. 17a, variable nodes requiring reading according to the update of each variable node are listed in Table 1 below.

TABLE 1

| | Updated variable node | | | |
|---|---|---|---|---|
| V1 | V2 | V3 | V4 | V5 |
| Read variable node V1, V2, V3 | V2, V4 V1, V2, V3 V2, V3, V4, V5 | V1, V2, V3 V2, V3, V4, V5 | V2, V4 V2, V3, V4, V5 V4, V5 | V2, V3, V4, V5 V4, V5 |

In the illustrated case of FIG. 17b, variable nodes requiring reading according to the update of each variable node are listed in Table 2 below.

TABLE 2

| | Updated variable node | | | |
|---|---|---|---|---|
| V1 | V2 | V3 | V4 | V5 |
| Read variable node V1, V2, V3 | V2, V4 V1, V2, V3 V3 V4, V5 | V1, V2, V3 V4, V5 | V2, V4 V2, V3, V4, V5 | V2, V3, V4, V5 |

In the case of FIG. 17a, therefore, when all the variable nodes are updated, 33 memory reads are required for the variable nodes for syndrome check. On the other hand, in the case of FIG. 17b, 24 memory reads are required. Therefore, the number of memory reads may be greatly reduced.

In the above-described embodiments, the value of a variable node may be determined based on a likelihood ratio. Therefore, the above-described embodiments may be applied to a sum-product algorithm as well as a min-sum algorithm (e.g., a Viterbi algorithm).

Figure 18:
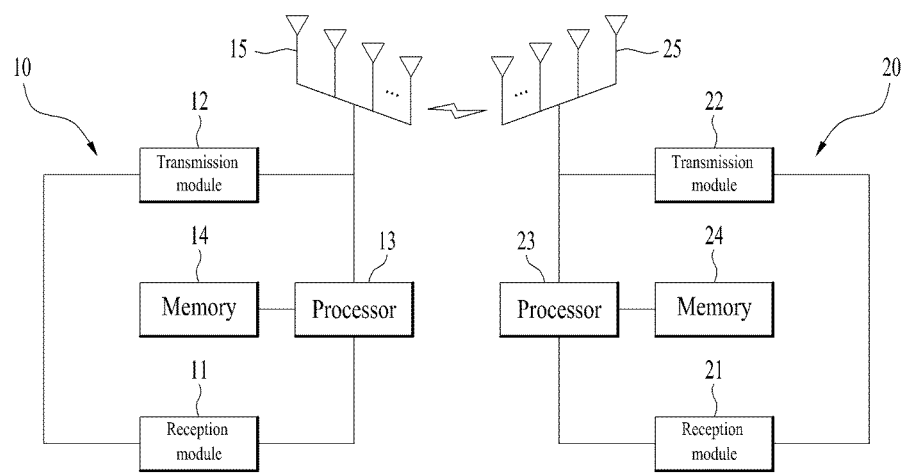
FIG. 18 is a diagram illustrating the configuration of a BS and a UE according to an embodiment of the present invention.

FIG. 18 is a diagram schematically illustrating the configuration of devices to which embodiments of the present invention described in FIGS. 1 to 17b are applicable according to an embodiment of the present invention.

Referring to FIG. 18, a BS 10 according to the present invention may include a reception module 11, a transmission module 12, a processor 13, a memory 14, and a plurality of antennas 15. The transmission module 12 may transmit a variety of signals, data, and information to an external device (e.g., UE). The reception module 11 may receive a variety of signals, data, and information from the external device (e.g., UE). The reception module 11 and the transmission module 12 may be referred to as a transceiver. The processor 13 may control overall operation of the BS 10. The plural antennas 15 may be configured according to, for example, a 2-dimensional antenna arrangement.

The processor 13 of the BS 10 according to an example of the present invention may be configured to receive channel state information according to the examples proposed in the present invention. The processor 13 of the BS 10 processes information received by the BS 10 and information to be transmitted to the outside of the BS 10. The memory 14 may store the processed information for a predetermined time and may be replaced with a component such as a buffer (not shown).

Referring to FIG. 18, a UE 20 according to the present invention may include a reception module 21, a transmission module 22, a processor 23, a memory 24, and a plurality of antennas 25. Use of the plurality of antennas 25 means that the UE 20 supports Multiple Input Multiple Output (MIMO) transmission and reception using the plurality of antennas 25. The transmission module 22 may transmit a variety of signals, data, and information to an external device (e.g., BS). The reception module 21 may receive a variety of signals, data, and information from the external device (e.g., BS). The reception module 21 and the transmission module 22 may be referred to as a transceiver. The processor 23 may control overall operation of the BS 10.

The processor 23 of the UE 10 according to an example of the present invention may be configured to transmit channel state information according to the examples proposed in the present invention. The processor 23 of the UE 20 processes information received by the UE 20 and information to be transmitted to the outside of the UE 10. The memory 24 may store the processed information for a predetermined time and may be replaced with a component such as a buffer (not shown).

The detailed configurations of the UE 10 may be implemented such that the above-described various embodiments of the present invention are independently applied or two or more embodiments of the present invention are simultaneously applied. Redundant matters will not be described herein for clarity.

In described various embodiments of the present invention, while the BS has been mainly described as an example of a downlink transmission entity or an uplink reception entity and the UE has been mainly described as an example of a downlink reception entity or an uplink transmission entity, the scope of the present invention is not limited thereto. For example, a description of the BS may be identically applied when a cell, an antenna port, an antenna port group, a remote radio head (RRH), a transmission point, a reception point, an access point, or a relay is a downlink transmission entity to the UE or an uplink reception entity from the UE. In addition, the principle of the present invention described through various embodiments of the present invention may be identically applied to a relay acting as a downlink transmission entity to the UE or an uplink reception entity from the UE, or a relay acting as an uplink transmission entity to the BS or a downlink reception entity from the BS.

The embodiments of the present invention may be implemented by various means, for example, hardware, firmware, software, or a combination thereof.

In a hardware configuration, the method according to the embodiments of the present invention may be implemented by one or more application specific integrated circuits (ASICs), digital signal processors (DSPs), digital signal processing devices (DSPDs), programmable logic devices (PLDs), field programmable gate arrays (FPGAs), processors, controllers, microcontrollers, or microprocessors.

In a firmware or software configuration, the method according to the embodiments of the present invention may be implemented in the form of modules, procedures, functions, etc. performing the above-described functions or operations. Software code may be stored in a memory unit and executed by a processor. The memory unit may be located at the interior or exterior of the processor and may transmit and receive data to and from the processor via various known means.

The embodiments described above are combinations of components and features of the present invention in a prescribed form. Each component or feature may be considered selective unless explicitly mentioned otherwise. Each component or feature may be executed in a form that is not combined with other components and features. Further, some components and/or features may be combined to configure an embodiment of the present invention. The order of operations described in the embodiments of the present invention may be changed. Some components or features of an embodiment may be included in another embodiment or may be substituted with a corresponding component or feature of the present invention. It is obvious to those skilled in the art that claims that are not explicitly cited in each other in the appended claims may be presented in combination as an embodiment of the present invention or included as a new claim by subsequent amendment after the application is filed.

It will be apparent to those skilled in the art that the present invention can be embodied in other specific forms without departing from the spirit and essential characteristics of the invention. Thus, the above embodiments are to be considered in all respects as illustrative and not restrictive. The scope of the invention should be determined by reasonable interpretation of the appended claims and all changes which come within the equivalent scope of the invention are within the scope of the invention.

INDUSTRIAL APPLICABILITY

The embodiments of the present disclosure are applicable to various wireless access systems and broadcasting communication systems. The various wireless access systems include, for example, a 3GPP system, a 3GPP2 system and/or an IEEE 802.xx system. The embodiments of the present disclosure are applicable to all technical fields in which the various wireless access systems find their use as well as the various wireless access systems.

The invention claimed is:

1. A method for layered decoding of a low-density parity-check (LDPC) code at a user equipment (UE), the method comprising:
    calculating a log likelihood ratio value from an input signal;
    initializing a plurality of variable nodes based on the log likelihood ratio value; and
    performing an iteration process including a check node update and a variable node update, wherein the check node update is performed for a plurality of check nodes based on both a parity check matrix and values of the plurality of variable nodes, and the variable node update is performed for the plurality of variable nodes based on both the parity check matrix and values of the plurality of check nodes, and wherein the iteration process is performed until it is determined whether decoding of the input signal is successful or failed based on syndrome check for the plurality of check nodes,
    wherein each iteration cycle of the iteration process comprises:
        determining specific variable nodes whose values are actually changed at a present iteration cycle through the variable node update, from among the plurality of variable nodes;
        performing syndrome check only for specific check nodes which are associated with the specific variable nodes from among the plurality of check nodes, wherein association between the plurality of check nodes and the plurality of variable nodes is determined based on the parity check matrix; and
        determining whether the decoding is successful based on whether partial syndrome check values obtained by performing the syndrome check for the specific check nodes are all zeros (0).

2. The method according to claim 1, wherein if a total number of iteration cycles counted during the iteration process is greater than a predetermined number, it is determined that the decoding is failed.

3. The method according to claim 1, wherein the performing of syndrome check comprises performing the syndrome check by exclusive OR (XOR)-operating values of the specific variable nodes.

4. A user equipment (UE) comprising:
    a transceiver configured to transmit and receive a signal;
    a memory; and
    a processor configured to control the transceiver and the memory,
    wherein the processor is further configured to:
    calculate a log likelihood ratio value from an input signal,
    initialize a plurality of variable nodes based on the log likelihood ratio value, and
    perform an iteration process including a check node update and a variable node update, wherein the check node update is performed for a plurality of check nodes based on both a parity check matrix and values of the plurality of variable nodes, and the variable node update is performed for the plurality of variable nodes based on both the parity check matrix and values of the plurality of check nodes, and wherein the iteration process is performed until it is determined whether decoding of the input signal is successful or failed based on syndrome check for the plurality of check nodes, and
    wherein each iteration cycle of the iteration process comprises:
        determining specific variable nodes whose values are actually changed at a present iteration cycle through the variable node update, from among the plurality of variable nodes:
        performing syndrome check only for specific check nodes which are associated with the specific variable nodes from among the plurality of check nodes, wherein association between the plurality of check nodes and the plurality of variable nodes is determined based on the parity check matrix; and
        determining whether the decoding is successful based on whether partial syndrome check values obtained by performing the syndrome check for the specific check nodes are all zeros (0s).

* * * * *